United States Patent
Lee

(10) Patent No.: US 10,636,510 B2
(45) Date of Patent: Apr. 28, 2020

(54) FUSE RUPTURE METHOD AND SEMICONDUCTOR DEVICE RELATED TO A RUPTURE OPERATION

(71) Applicant: SK hynix Inc., Icheon-si Gyeonggi-do (KR)

(72) Inventor: Joohyeon Lee, Bucheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 16/175,660

(22) Filed: Oct. 30, 2018

(65) Prior Publication Data

US 2019/0311778 A1     Oct. 10, 2019

(30) Foreign Application Priority Data

Apr. 10, 2018  (KR) .................. 10-2018-0041457

(51) Int. Cl.
| | | |
|---|---|---|
| *G11C 29/44* | (2006.01) | |
| *G11C 29/38* | (2006.01) | |
| *G11C 17/18* | (2006.01) | |
| *G11C 17/16* | (2006.01) | |

(52) U.S. Cl.
CPC .......... *G11C 29/4401* (2013.01); *G11C 17/16* (2013.01); *G11C 17/18* (2013.01); *G11C 29/38* (2013.01)

(58) Field of Classification Search
CPC ..... G11C 29/4401; G11C 17/16; G11C 17/18; G11C 29/38
USPC .......................................................... 365/96
See application file for complete search history.

(56) References Cited

U.S. PATENT DOCUMENTS 9,747,998 B2 * 8/2017 Kim .................. G11C 17/16
2016/0351276 A1 * 12/2016 Shim ................. G11C 29/78

FOREIGN PATENT DOCUMENTS

KR      101710056 B1    2/2017

* cited by examiner

*Primary Examiner* — Fernando Hidalgo
(74) *Attorney, Agent, or Firm* — William Park & Associates Ltd.

(57) ABSTRACT

A semiconductor device includes a fuse array circuit including a plurality of fuse cell arrays, and configured to output fuse data based on one or more fuses that have been ruptured or not within a fuse cell array; and a fuse control circuit configured to compare the fuse data and one or more failure addresses, and re-perform a rupture operation for the fuse cell array when the fuse data and the failure addresses indicate a difference between the fuse data and the failure addresses.

30 Claims, 13 Drawing Sheets

FIG. 3

| CNT<2> | CNT<1> | RDON | VRD | REN | RDIS |
|---|---|---|---|---|---|
| L | L | H | L | L | L |
| L | H | L | H | L | L |
| H | L | L | L | H | L |
| H | H | L | L | L | H |

FUSE RUPTURE METHOD AND SEMICONDUCTOR DEVICE RELATED TO A RUPTURE OPERATION

CROSS-REFERENCE TO RELATED APPLICATION

The present application claims priority under 35 U.S.C. § 119(a) to Korean Patent Application No. 10-2018-0041457 filed on Apr. 10, 2018 in the Korean Intellectual Property Office, which is incorporated herein by reference in its entirety.

BACKGROUND

1. Technical Field

Embodiments of the present disclosure generally relate to a semiconductor device, and more particularly, to a semiconductor device related to a rupture operation.

2. Related Art

In a semiconductor device, a repair technology used for repairing a failed memory cell to a normal memory cell to allow a chip to operate normally is generally divided into two methods. A first method is a fuse cutting method using a laser device. A second method is a method in which a predetermined amount of high current is applied to a material forming a fuse such that the material of the fuse is ruptured and as a result the state of the fuse is electrically shorted.

In particular, the second method as a method capable of being used even after the assembly of a chip into a package is completed is referred to as an e-fuse method. In the e-fuse method, since a failed cell may be repaired to a normal cell in a package state, the e-fuse method is gaining popularity among chip manufacturers when compared to the fuse cutting method using the laser device.

However, in the e-fuse method, problems are caused in that, since the material may not be completely ruptured through one rupture operation, a malfunction may occur and a reliability issue may be raised because the fuse is likely to return to a state before rupture.

SUMMARY

In an embodiment, a semiconductor device may be provided. The semiconductor device may include a fuse array circuit including a plurality of fuse cell arrays, and configured to output fuse data based on one or more fuses that have been ruptured or not within a fuse cell array which is selected depending on internal addresses is ruptured or not. The semiconductor device may include a fuse control circuit configured to compare the fuse data and one or more failure addresses, and re-perform a rupture operation for the fuse cell array when the fuse data and the failure addresses indicate a difference between the fuse data and the failure addresses.

In an embodiment, a semiconductor device may be provided. The semiconductor device may include a fuse array circuit including first and second fuse cell arrays, and configured to output first and second fuse data depending on whether the first and second fuse cell arrays include one or more fuses that are ruptured or not. The semiconductor device may include a fuse control circuit configured to sequentially compare logic levels of the first and second fuse data and logic levels of failure addresses, re-perform a rupture operation for the first fuse cell array corresponding to the first fuse data when the logic levels of the first fuse data are different from the logic levels of the failure addresses, and re-perform a rupture operation for the second fuse cell array corresponding to the second fuse data when the logic levels of the second fuse data are different from the logic levels of the failure addresses.

In an embodiment, a fuse rupture method may be provided. The fuse rupture method may include performing a read operation of outputting fuse data depending on whether one or more fuses for each of a plurality of fuse cell arrays is ruptured or not. The fuse rupture method may include comparing the fuse data and failure addresses, and re-performing a rupture operation for a corresponding fuse cell array when logic level combinations of the fuse data and the failure addresses are different.

BRIEF DESCRIPTION OF THE DRAWINGS

FIG. 3 is a representation of an example of a table to assist in the explanation of the operation of the control circuit illustrated in FIG. 2.

DETAILED DESCRIPTION

Hereinafter, a fuse rupture method and a semiconductor device using the same will be described below with reference to the accompanying drawings through various examples of embodiments.

Various embodiments may be directed to a fuse rupture method capable of detecting a result of a rupture operation and re-performing the rupture operation in the case where the rupture operation is not completed as a result of detection, and a semiconductor device using the same.

According to the embodiments, by detecting a result of a rupture operation and re-performing the rupture operation in the case where the rupture operation is not completed as a result of detection, it may be possible to secure the reliability of a fuse rupture operation.

Also, according to the embodiments, by detecting a result of a rupture operation and outputting a detection result to an exterior, it may be possible to monitor the rupture operation.

Figure 1:
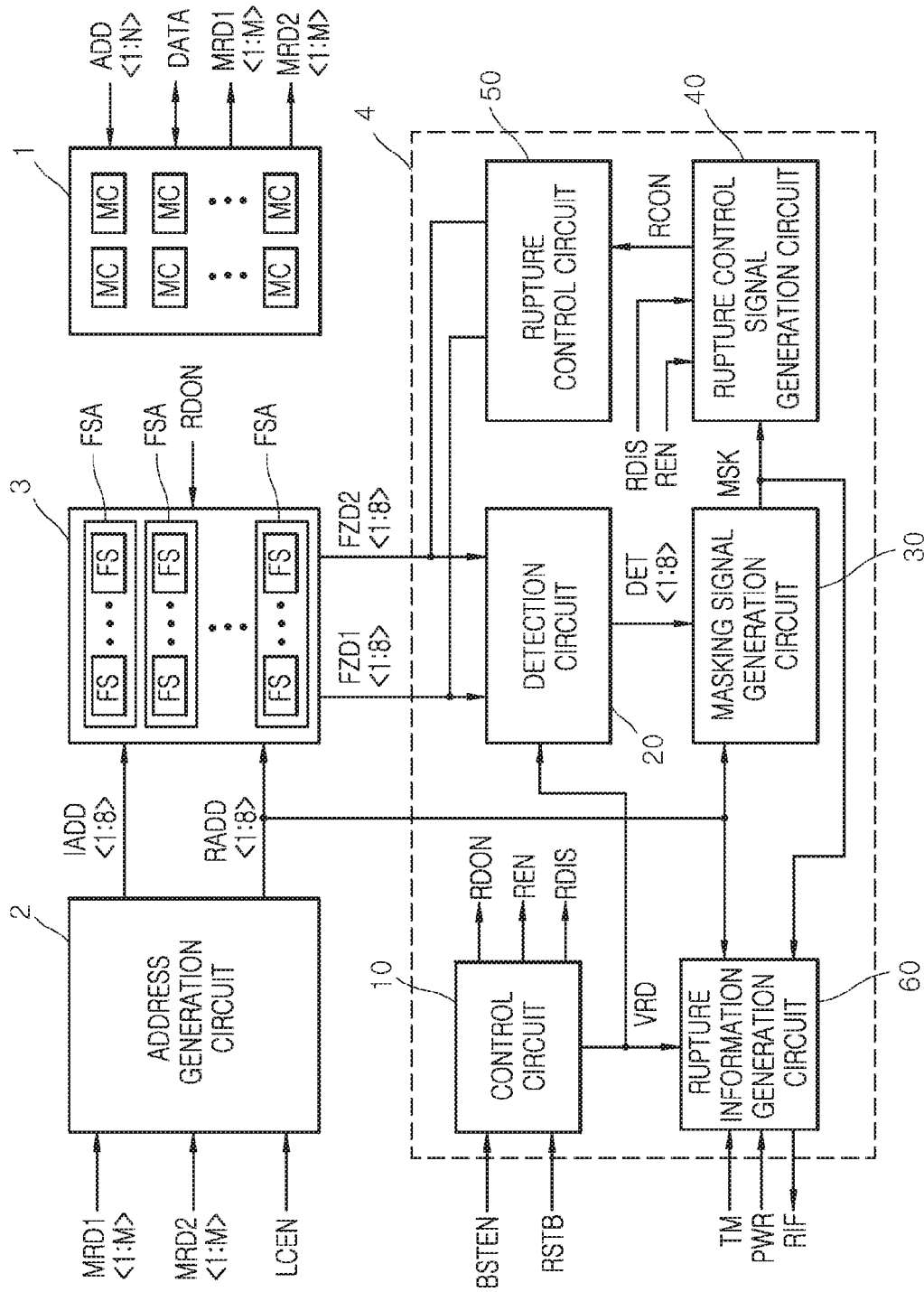
FIG. 1 is a block diagram illustrating a representation of an example of the configuration of a semiconductor device in accordance with an embodiment.

Referring to FIG. 1, a semiconductor device in accordance with an embodiment may include a memory circuit 1, an address generation circuit 2, a fuse array circuit 3 and a fuse control circuit 4.

The memory circuit 1 may store data DATA in a memory cell MC which is selected depending on an external address ADD<1:N>, and may output stored data DATA to an exterior. In a write operation, the memory circuit 1 may store data DATA in a memory cell MC which is selected depending on the external address ADD<1:N>. In a read operation, the memory circuit 1 may output data DATA stored in a memory cell MC which is selected depending on the external address ADD<1:N>, to an exterior. The memory circuit 1 may generate first repair information MRD1<1:M> which includes the position information of a memory cell MC where a failure has occurred. The memory circuit 1 may generate second repair information MRD2<1:M> which includes the position information of a memory cell MC where a failure has occurred. The memory circuit 1 may be embodied by a volatile memory device or a nonvolatile memory device including general memory cells MC. The memory circuit 1 may include a test circuit (not illustrated) which generates the first repair information MRD1<1:M> and the second repair information MRD2<1:M> including the position informations of memory cells MC where failures have occurred. The first repair information MRD1<1:M> and the second repair information MRD2<1:M> may include the position information of different memory cells MC where failures have occurred. While it is illustrated that the memory circuit 1 generates the first repair information MRD1<1:M> and the second repair information MRD2<1:M> including the position information of two memory cells MC where failures have occurred, it is to be noted that repair information may be generated by the number of memory cells MC where failures have occurred.

The address generation circuit 2 may generate first to eighth internal addresses IADD<1:8> and first to eighth failure addresses RADD<1:8> from the first repair information MRD1<1:M> in response to a latch enable signal LCEN. The address generation circuit 2 may generate the first to eighth internal addresses IADD<1:8> from the first repair information MRD1<1:M> in response to the first pulse of the latch enable signal LCEN. The address generation circuit 2 may generate the first to eighth failure addresses RADD<1:8> from the first repair information MRD1<1:M> in response to the second pulse of the latch enable signal LCEN. The address generation circuit 2 may generate first to eighth internal addresses IADD<1:8> and first to eighth failure addresses RADD<1:8> from the second repair information MRD2<1:M> in response to the latch enable signal LCEN. The address generation circuit 2 may generate the first to eighth internal addresses IADD<1:8> from the second repair information MRD2<1:M> in response to the first pulse of the latch enable signal LCEN. The address generation circuit 2 may generate the first to eighth failure addresses RADD<1:8> from the second repair information MRD2<1:M> in response to the second pulse of the latch enable signal LCEN. While the first to eighth internal addresses IADD<1:8> and the first to eighth failure addresses RADD<1:8> are set to 8 bits, it is to be noted that they may be set to various numbers of bits depending on an embodiment. The latch enable signal LCEN may be set as a signal including a first pulse and a second pulse which are sequentially generated in a rupture operation for a fuse cell array FSA. The logic levels of the first pulse and the second pulse of the latch enable signal LCEN may be set variously depending on an embodiment. In some embodiments, the first repair information MRD1<1:M> may be inputted to the address generation circuit 2 from an exterior. In some embodiments, the second repair information MRD2<1:M> may be inputted to the address generation circuit 2 from an exterior.

The fuse array circuit 3 may include a plurality of fuse cell arrays FSA. The fuse cell arrays include a plurality of fuse FS. The fuse array circuit 3 performs a rupture operation for a fuse cell array FSA which is selected depending on the internal addresses IADD<1:8> in a write operation, to correspond to the logic levels of the first to eighth failure addresses RADD<1:8>. Each fuse cell array FSA may be set to have the number of bits corresponding to the failure addresses RADD<1:8>. The fuse array circuit 3 may generate first fuse data FZD1<1:8> and second fuse data FZD2<1:8> in response to a read control signal RDON which is enabled in a read operation. The fuse array circuit 3 may generate the first fuse data FZD1<1:8> which have the same logic levels as the failure addresses RADD<1:8>, as a fuse cell array FSA is ruptured. The fuse array circuit 3 may generate the second fuse data FZD2<1:8> which have the same logic levels as the failure addresses RADD<1:8>, as a fuse cell array FSA is ruptured. The first fuse data FZD1<1:8> and the second fuse data FZD2<1:8> may be generated as different fuse cell arrays are ruptured. The first fuse data FZD1<1:8> and the second fuse data FZD2<1:8> may be generated in different logic level combinations.

The fuse control circuit 4 may include a control circuit 10, a detection circuit 20, a masking signal generation circuit 30, a rupture control signal generation circuit 40, a rupture control circuit 50 and a rupture information generation circuit 60.

The control circuit 10 may generate the read control signal RDON, a voltage control signal VRD, a rupture enable signal REN and a rupture disable signal RDIS which are sequentially enabled in response to a reset signal RSTB and a test enable signal BSTEN. The reset signal RSTB may be set as a signal which is enabled for a predetermined period in a rupture operation for a fuse cell array FSA. The test enable signal BSTEN may be set as a signal including a pulse which is cyclically generated in a rupture operation for a fuse cell array FSA.

The detection circuit 20 may compare the logic levels of the first fuse data FZD1<1:8> and the level of a reference voltage VREF (see FIG. 4) in response to the voltage control signal VRD, and may generate first to eighth detection signals DET<1:8>. The detection circuit 20 may compare the logic levels of the second fuse data FZD2<1:8> and the level of the reference voltage VREF in response to the voltage control signal VRD, and generate first to eighth detection signals DET<1:8>. The detection circuit 20 may generate the first to eighth detection signals DET<1:8> from the second fuse data FZD2<1:8> after generating the first to eighth detection signals DET<1:8> from the first fuse data FZD1<1:8>.

The masking signal generation circuit 30 may compare the first to eighth detection signals DET<1:8> and the first to eighth failure addresses RADD<1:8>, and generate a masking signal MSK. The masking signal generation circuit 30 may generate the masking signal MSK which is enabled in the case where the logic level combination of the first to eighth detection signals DET<1:8> and the logic level combination of the first to eighth failure addresses RADD<1:8> are different.

The rupture control signal generation circuit 40 may generate a rupture control signal RCON which is enabled in response to the rupture enable signal REN, the rupture disable signal RDIS and the masking signal MSK. The rupture control signal generation circuit 40 may generate the rupture control signal RCON which is enabled in response to the rupture enable signal REN and the masking signal MSK. The rupture control signal generation circuit 40 may generate the rupture control signal RCON which is disabled in response to the rupture disable signal RDIS and the masking signal MSK.

The rupture control circuit 50 may apply a high current to the fuse cell array FSA in which the first fuse data FZD1<1:8> are stored, in response to the rupture control signal RCON. The rupture control circuit 50 may apply a high current to the fuse cell array FSA in which the second fuse data FZD2<1:8> are stored, in response to the rupture control signal RCON. The rupture control circuit 50 may perform the rupture operation for the fuse cell array FSA in which the first fuse data FZD1<1:8> are stored, by applying the high current to the fuse cell array FSA in response to the rupture control signal RCON. The rupture control circuit 50 may repeatedly apply the high current to the fuse cell array FSA in which the first fuse data FZD1<1:8> are stored, for a period in which the rupture control signal RCON is enabled. The rupture control circuit 50 may perform the rupture operation for the fuse cell array FSA in which the second fuse data FZD2<1:8> are stored, by applying the high current to the fuse cell array FSA in response to the rupture control signal RCON. The rupture control circuit 50 may repeatedly apply the high current to the fuse cell array FSA in which the second fuse data FZD2<1:8> are stored, for a period in which the rupture control signal RCON is enabled. The rupture control circuit 50 may perform the rupture operation for the fuse cell array FSA in which the second fuse data FZD2<1:8> are stored, after the rupture operation for the fuse cell array FSA in which the first fuse data FZD1<1:8> are stored is completed, in response to the rupture control signal RCON. The high current may be set to have a high current amount for rupturing the material of the fuse cell arrays FSA which are embodied by e-fuses.

The rupture information generation circuit 60 may generate rupture information RIF which is initialized in response to a power-up signal PWR. The rupture information generation circuit 60 may output the rupture information RIF which is enabled in the case where the rupture operation for a fuse cell array FSA is completed, in response to the voltage control signal VRD. The rupture information RIF may include information on the completion of the rupture operation for a fuse cell array FSA corresponding to all the bits of the first to eighth failure addresses RADD<1:8>. The rupture information RIF may be enabled in the case where the rupture operation for a fuse cell array FSA corresponding to all the bits of the first to eighth failure addresses RADD<1:8> is not completed. A logic level at which the rupture information RIF is enabled may be set variously depending on an embodiment.

Figure 2:
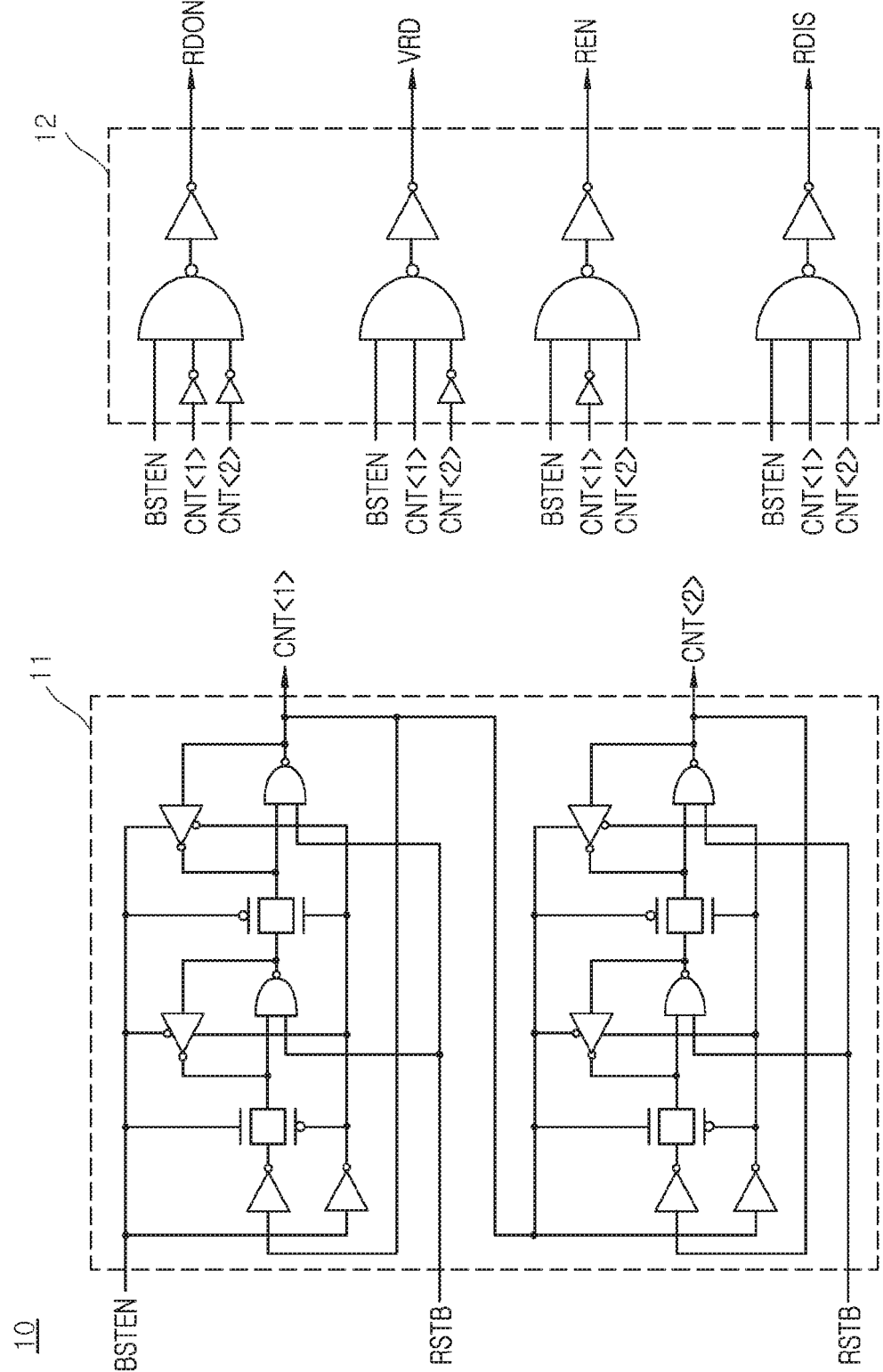
FIG. 2 is a circuit diagram illustrating a representation of an example of the configuration of the control circuit included in the fuse control circuit illustrated in FIG. 1.

Referring to FIG. 2, the control circuit 10 may include a first counter 11 and a decoder 12.

The first counter 11 may generate a first counting signal CNT<1> and a second counting signal CNT<2> which are initialized in response to the reset signal RSTB. The first counter 11 may generate the first counting signal CNT<1> and the second counting signal CNT<2> which are initialized to logic high levels, in the case where the reset signal RSTB is enabled to a logic low level. The first counter 11 may generate the first counting signal CNT<1> and the second counting signal CNT<2> which are sequentially counted, in response to the test enable signal BSTEN. The first counter 11 may be embodied by a counter circuit.

The decoder 12 may generate the read control signal RDON, the voltage control signal VRD, the rupture enable signal REN and the rupture disable signal RDIS which are sequentially enabled depending on the logic level combination of the first counting signal CNT<1> and the second counting signal CNT<2> in response to the test enable signal BSTEN. The logic levels of the first counting signal CNT<1> and the second counting signal CNT<2> for generating the read control signal RDON, the voltage control signal VRD, the rupture enable signal REN and the rupture disable signal RDIS will be described below with reference to FIG. 3.

The logic levels of the read control signal RDON, the voltage control signal VRD, the rupture enable signal REN and the rupture disable signal RDIS which are generated depending on the logic levels of the first counting signal CNT<1> and the second counting signal CNT<2> may be described with reference to FIG. 3 as follows.

In the case where the first counting signal CNT<1> is a logic low level and the second counting signal CNT<2> is a logic low level, the read control signal RDON is enabled to a logic high level.

In the case where the first counting signal CNT<1> is the logic high level and the second counting signal CNT<2> is the logic low level, the voltage control signal VRD is enabled to a logic high level.

In the case where the first counting signal CNT<1> is the logic low level and the second counting signal CNT<2> is the logic high level, the rupture enable signal REN is enabled to a logic high level.

In the case where the first counting signal CNT<1> is the logic high level and the second counting signal CNT<2> is the logic high level, the rupture disable signal RDIS is enabled to a logic high level.

That is to say, the control circuit 10 may generate the read control signal RDON, the voltage control signal VRD, the rupture enable signal REN and the rupture disable signal RDIS which are sequentially enabled, in the case where the first counting signal CNT<1> and the second counting signal CNT<2> are sequentially counted.

Figure 4:
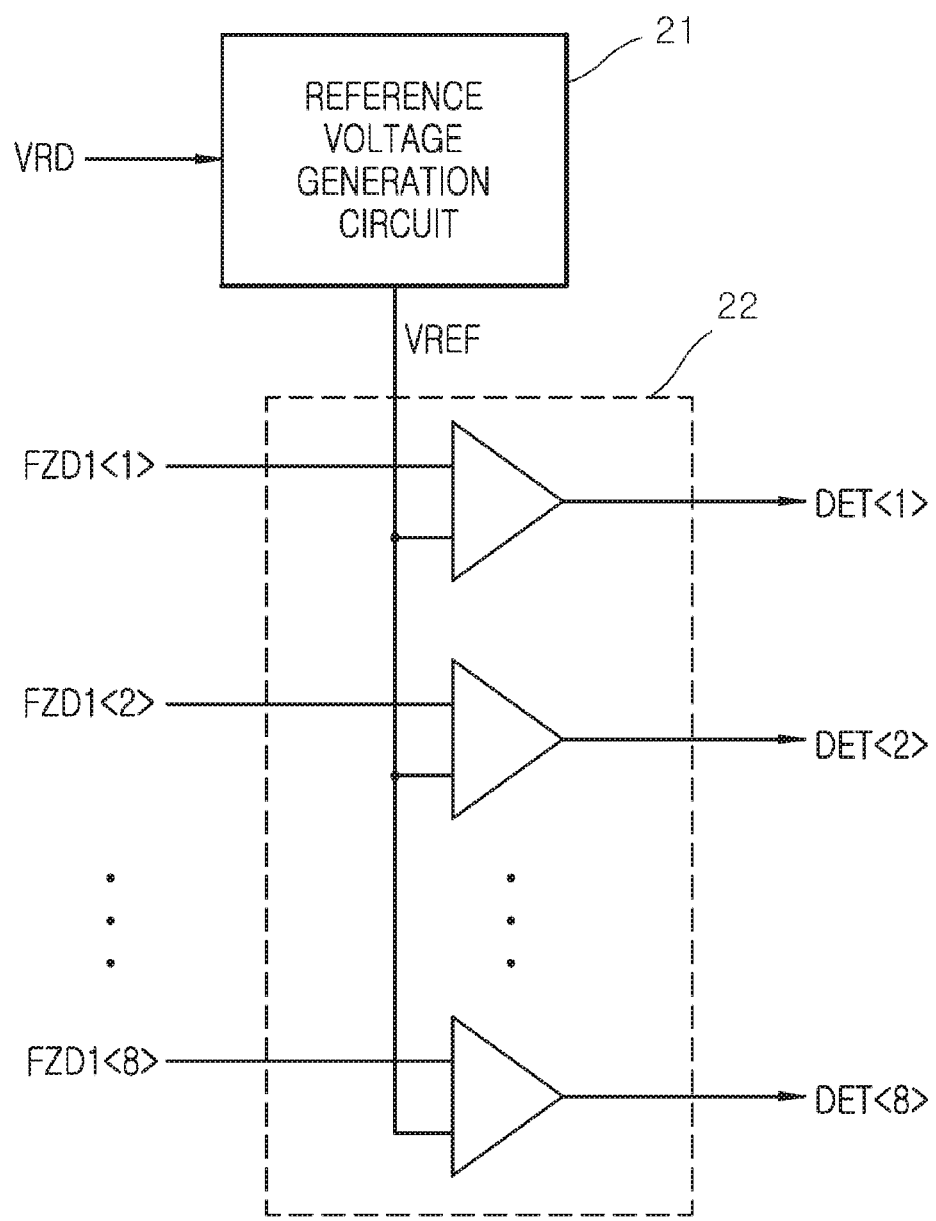
FIG. 4 is a block diagram illustrating a representation of an example of the configuration of the detection circuit included in the fuse control circuit illustrated in FIG. 1.

Referring to FIG. 4, the detection circuit 20 may include a reference voltage generation circuit 21 and a detection signal generation circuit 22.

The reference voltage generation circuit 21 may generate the reference voltage VREF which is adjusted in its voltage level in response to the voltage control signal VRD. The reference voltage generation circuit 21 may generate the reference voltage VREF which has a predetermined level, in response to the voltage control signal VRD. The reference voltage VREF may be set to a voltage level for detecting the logic levels of the first fuse data FZD1<1:8> and the second fuse data FZD2<1:8> in rupture operations.

The detection signal generation circuit 22 may compare the first fuse data FZD1<1:8> and the reference voltage VREF, and generate the first to eighth detection signals DET<1:8>. The detection signal generation circuit 22 may generate the first detection signal DET<1> which has a logic high level, in the case where the level of the first bit FZD1<1> included in the first fuse data FZD1<1:8> is higher than the reference voltage VREF. The detection signal generation circuit 22 may generate the second detection signal DET<2> which has a logic high level, in the case where the level of the second bit FZD1<2> included in the first fuse data FZD1<1:8> is higher than the reference voltage VREF. The detection signal generation circuit 22 may generate the eighth detection signal DET<8> which has a logic high level, in the case where the level of the eighth bit FZD1<8> included in the first fuse data FZD1<1:8> is higher than the reference voltage VREF.

While the detection circuit 20 illustrated in FIG. 4 is embodied in such a manner that the first to eighth detection signals DET<1:8> are generated by comparing the first fuse data FZD1<1:8> and the reference voltage VREF, the detection circuit 20 may be embodied in such a manner that the first to eighth detection signals DET<1:8> are generated by comparing the second fuse data FZD2<1:8> and the reference voltage VREF.

Figure 5:
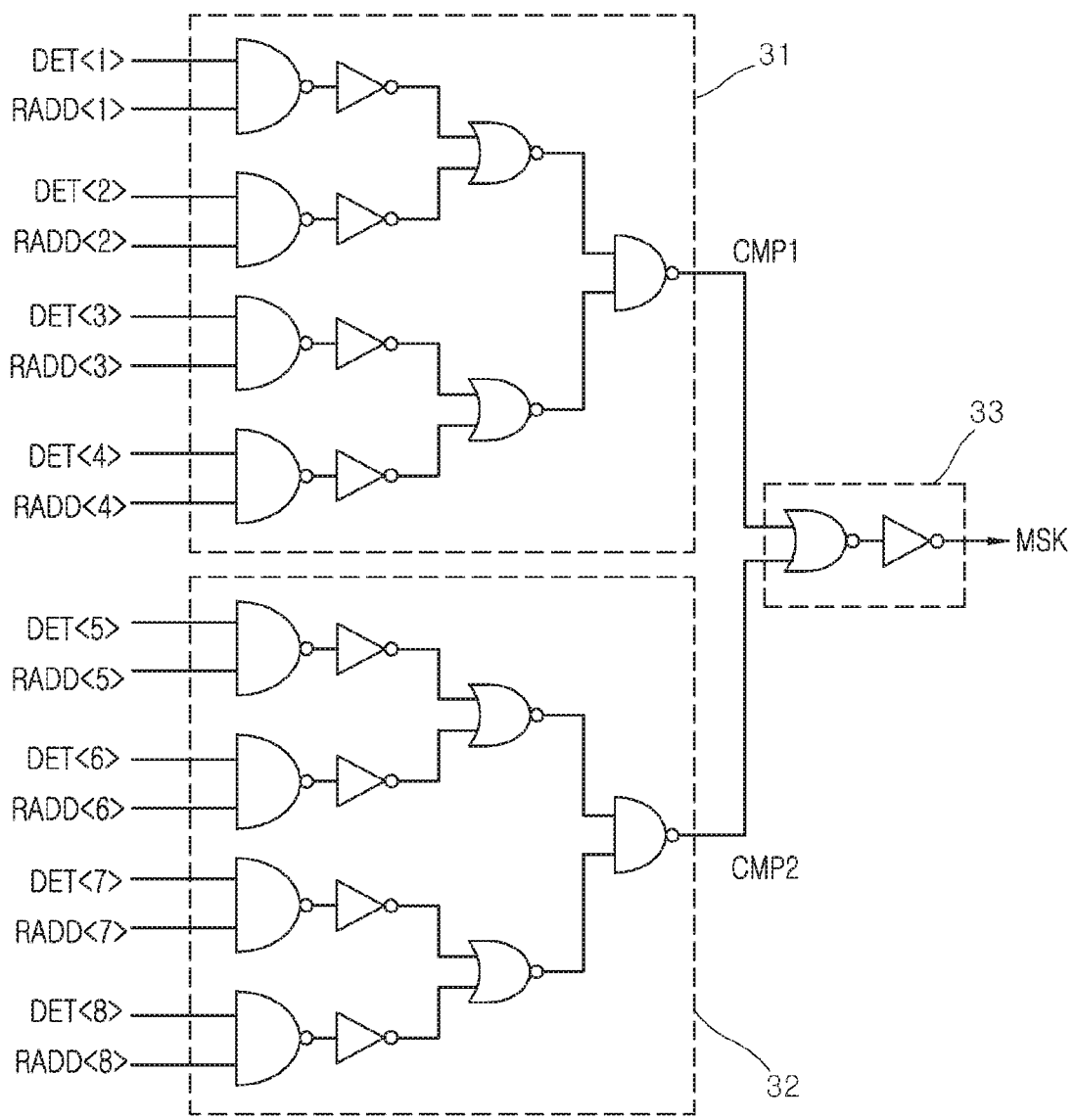
FIG. 5 is a circuit diagram illustrating a representation of an example of the configuration of the masking signal generation circuit included in the fuse control circuit illustrated in FIG. 1.

Referring to FIG. 5, the masking signal generation circuit 30 may include a first comparison circuit 31, a second comparison circuit 32 and a first logic circuit 33.

The first comparison circuit 31 may compare the first to fourth detection signals DET<1:4> and the first to fourth failure addresses RADD<1:4>, and generate a first comparison signal CMP1. The first comparison circuit 31 may generate the first comparison signal CMP1 which is enabled to a logic high level, in the case where the first detection signal DET<1> is the logic high level and the first failure address RADD<1> is a logic high level. The first comparison circuit 31 may generate the first comparison signal CMP1 which is enabled to the logic high level, in the case where the second detection signal DET<2> is the logic high level and the second failure address RADD<2> is a logic high level. The first comparison circuit 31 may generate the first comparison signal CMP1 which is enabled to the logic high level, in the case where the third detection signal DET<3> is a logic high level and the third failure address RADD<3> is a logic high level. The first comparison circuit 31 may generate the first comparison signal CMP1 which is enabled to the logic high level, in the case where the fourth detection signal DET<4> is a logic high level and the fourth failure address RADD<4> is a logic high level.

For example, in the case where the first bit FZD1<1> of the first fuse data FZD1<1:8> is not ruptured in the state in which the first failure address RADD<1> is the logic high level, the first detection signal DET<1> is generated at a logic low level. In the case where the first bit FZD1<1> of the first fuse data FZD1<1:8> is ruptured in the state in which the first failure address RADD<1> is the logic high level, since the first detection signal DET<1> is generated at the logic high level, the first comparison circuit 31 generates the first comparison signal CMP1 of the logic high level. In other words, in the case where the rupture operation for the first fuse data FZD1<1:4> is completed, the first comparison signal CMP1 of the logic high level is generated.

The second comparison circuit 32 may compare the fifth to eighth detection signals DET<5:8> and the fifth to eighth failure addresses RADD<5:8>, and generate a second comparison signal CMP2. The second comparison circuit 32 may generate the second comparison signal CMP2 which is enabled to a logic high level, in the case where the fifth detection signal DET<5> is a logic high level and the fifth failure address RADD<5> is a logic high level. The second comparison circuit 32 may generate the second comparison signal CMP2 which is enabled to the logic high level, in the case where the sixth detection signal DET<6> is a logic high level and the sixth failure address RADD<6> is a logic high level. The second comparison circuit 32 may generate the second comparison signal CMP2 which is enabled to the logic high level, in the case where the seventh detection signal DET<7> is a logic high level and the seventh failure address RADD<7> is a logic high level. The second comparison circuit 32 may generate the second comparison signal CMP2 which is enabled to the logic high level, in the case where the eighth detection signal DET<8> is the logic high level and the eighth failure address RADD<8> is a logic high level.

For example, in the case where the fifth bit FZD1<5> of the first fuse data FZD1<1:8> is not ruptured in the state in which the fifth failure address RADD<5> is the logic high level, the fifth detection signal DET<5> is generated at a logic low level. In the case where the fifth bit FZD1<5> of the first fuse data FZD1<1:8> is ruptured in the state in which the fifth failure address RADD<5> is the logic high level, since the fifth detection signal DET<5> is generated at the logic high level, the second comparison circuit 32 generates the second comparison signal CMP2 of the logic high level. In other words, in the case where the rupture operation for the first fuse data FZD1<5:8> is completed, the second comparison signal CMP2 of the logic high level is generated.

The first logic circuit 33 may generate the masking signal MSK which is enabled, in the case where any one of the first comparison signal CMP1 and the second comparison signal CMP2 is enabled. The first logic circuit 33 may generate the masking signal MSK by performing an OR logic operation for the first comparison signal CMP1 and the second comparison signal CMP2. The first logic circuit 33 may generate the masking signal MSK which is enabled to a logic high level, in the case where any one of the first comparison signal CMP1 and the second comparison signal CMP2 is the logic high level. A logic level at which the masking signal MSK is enabled may be set variously depending on an embodiment.

Since the first to eighth failure addresses RADD<1:8> include the position information of a memory cell MC where a failure has occurred, a case where all the bits thereof are generated at logic low levels does not occur. Further, a case where at least any one of the first fuse data FZD1<1:8> and the second fuse data FZD2<1:8> is generated at a logic high level represents a case where a fuse rupture operation is completed. Therefore, in the case where at least any one of the first to eighth detection signals DET<1:8> is generated at the logic high level and at least any one of the first to eighth failure addresses RADD<1:8> corresponding to the at least any one detection signal of the logic high level is the logic high level, the masking signal generation circuit 30 generates the masking signal MSK of the logic high level. Namely, in the case where the masking signal MSK of the logic high level is generated, it is meant that the rupture operation for the first fuse data FZD1<1:8> and the second fuse data FZD2<1:8> is completed.

Figure 6:
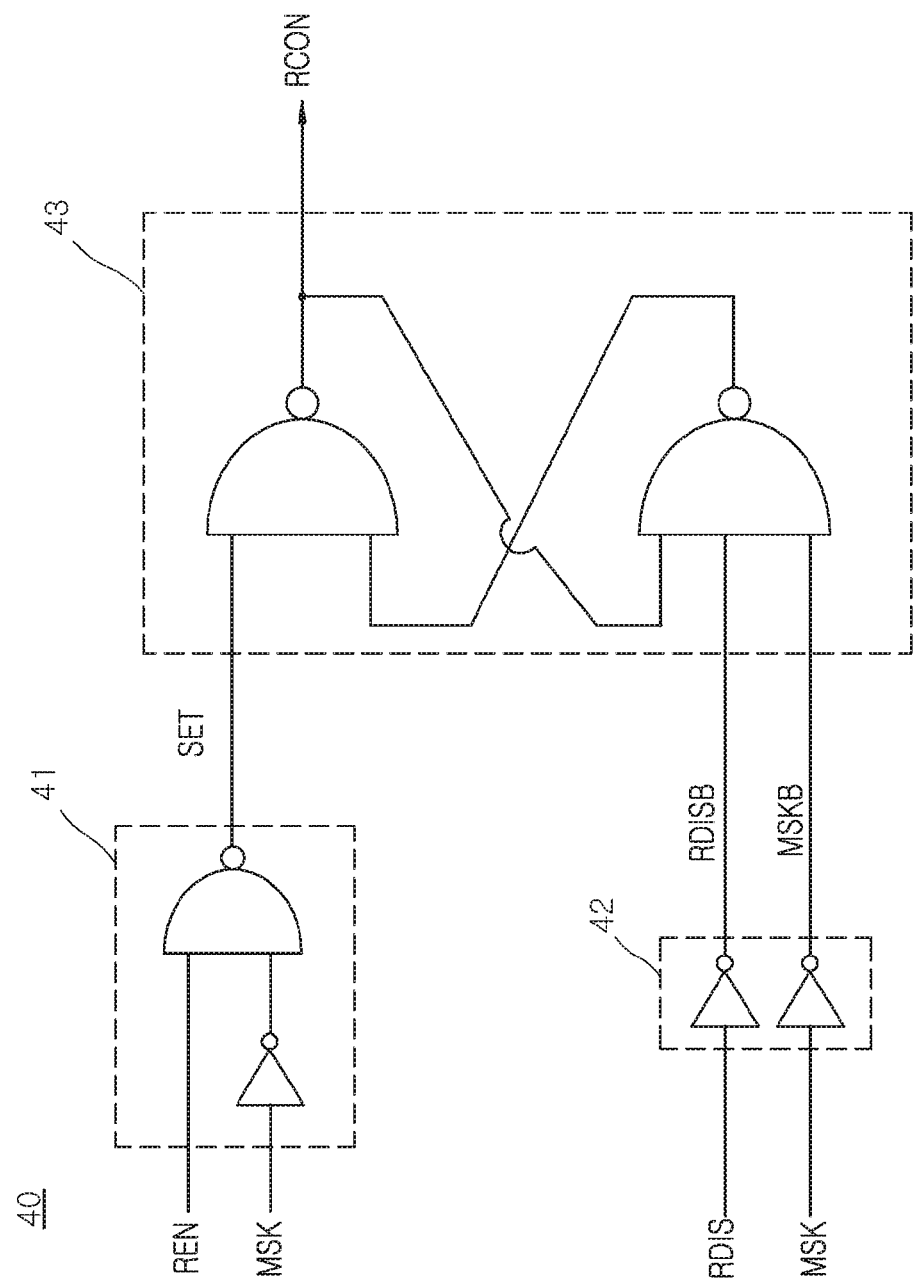
FIG. 6 is a circuit diagram illustrating a representation of an example of the configuration of the rupture control signal generation circuit included in the fuse control circuit illustrated in FIG. 1.

Referring to FIG. 6, the rupture control signal generation circuit 40 may include a setting signal generation circuit 41, a buffer circuit 42 and a rupture control signal output circuit 43.

The setting signal generation circuit 41 may generate a setting signal SET which is enabled in response to the rupture enable signal REN and the masking signal MSK. The setting signal generation circuit 41 may generate the setting signal SET which is enabled to a logic low level, in the case where the rupture enable signal REN is enabled to the logic high level and the masking signal MSK is a logic low level.

The buffer circuit 42 may generate an inverted rupture disable signal RDISB by inverting and buffering the rupture disable signal RDIS, and may generate an inverted masking signal MSKB by inverting and buffering the masking signal MSK.

The rupture control signal output circuit 43 may generate the rupture control signal RCON which is enabled in response to the setting signal SET and is disabled in response to the inverted rupture disable signal RDISB and the inverted masking signal MSKB. The rupture control signal output circuit 43 may generate the rupture control signal RCON which is enabled to a logic high level, in the case where the setting signal SET is enabled to the logic low level. The rupture control signal output circuit 43 may generate the rupture control signal RCON which is disabled to a logic low level, in the case where any one of the inverted rupture disable signal RDISB and the inverted masking signal MSKB is enabled to a logic low level.

Figure 7:
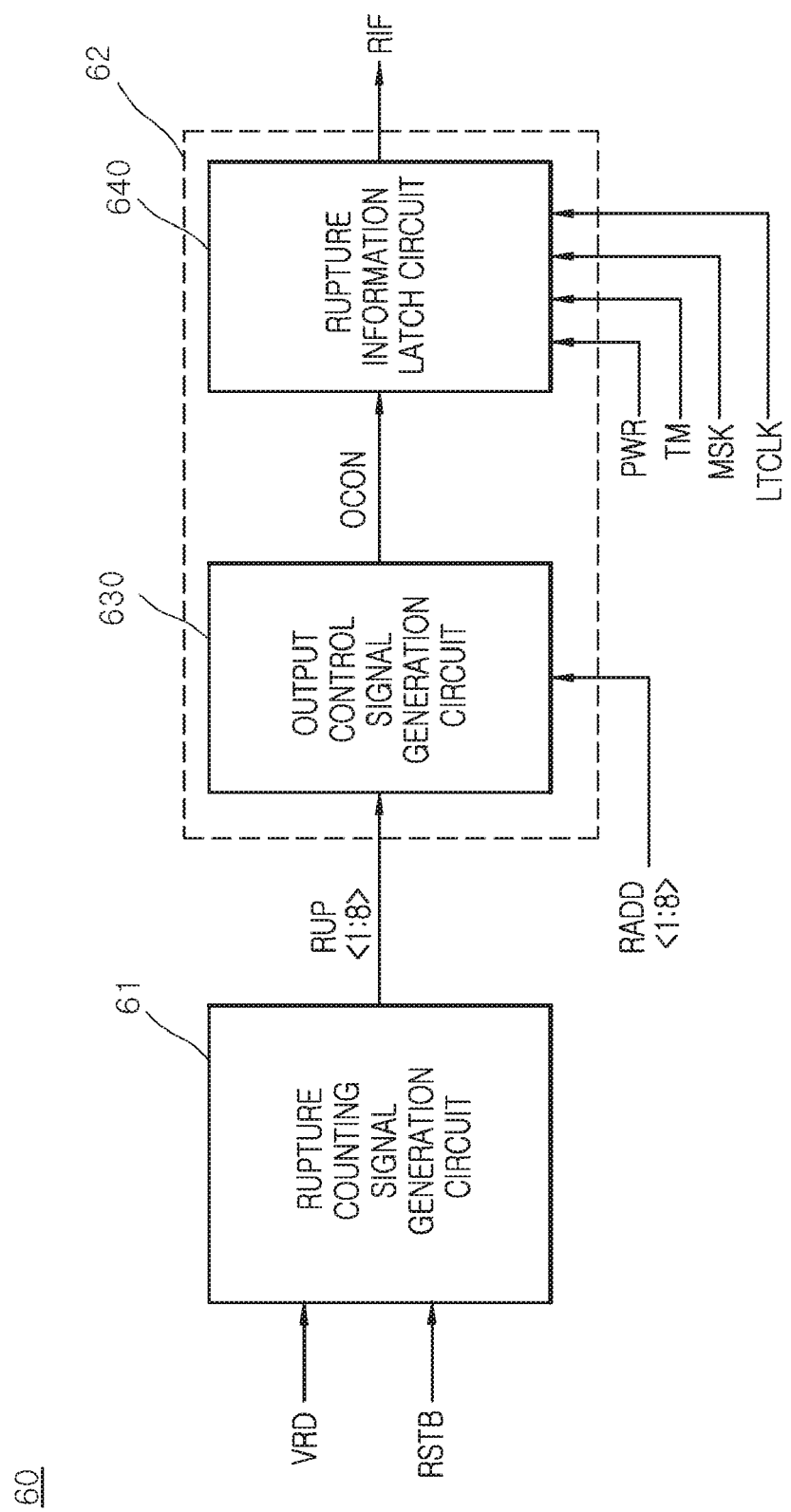
FIG. 7 is a block diagram illustrating a representation of an example of the configuration of the rupture information generation circuit included in the fuse control circuit illustrated in FIG. 1.

Referring to FIG. 7, the rupture information generation circuit 60 may include a rupture counting signal generation circuit 61 and a rupture information output circuit 62.

The rupture counting signal generation circuit 61 may generate first to eighth rupture counting signals RUP<1:8> which are initialized in response to the reset signal RSTB. The rupture counting signal generation circuit 61 may generate the first to eighth rupture counting signals RUP<1:8> which are sequentially counted in response to the voltage control signal VRD.

The rupture information output circuit 62 may include an output control signal generation circuit 630 and a rupture information latch circuit 640.

The output control signal generation circuit 630 may compare the first to eighth rupture counting signals RUP<1:8> and the first to eighth failure addresses RADD<1:8>, and generate an output control signal OCON. The output control signal generation circuit 630 may generate the output control signal OCON which is enabled to a logic low level at a time when any one of the first to eighth failure addresses RADD<1:8> is the logic high level during a period in which the first to eighth rupture counting signals RUP<1:8> are counted.

The rupture information latch circuit 640 may generate the rupture information RIF which is initialized in response to a test mode signal TM and the power-up signal PWR. The rupture information latch circuit 640 may generate the rupture information RIF which is initialized to a logic high level, in the case where the test mode signal TM is inputted at a logic high level. The rupture information latch circuit 640 may generate the rupture information RIF which is initialized to the logic high level, in the case where the power-up signal PWR is inputted at a logic low level. The rupture information latch circuit 640 may generate the rupture information RIF depending on the logic level of the masking signal MSK in response to the output control signal OCON and a latch clock LTCLK. The rupture information latch circuit 640 may output the rupture information RIF to an exterior. The latch clock LTCLK may be set as a signal including a pulse which is cyclically generated.

Figure 8:
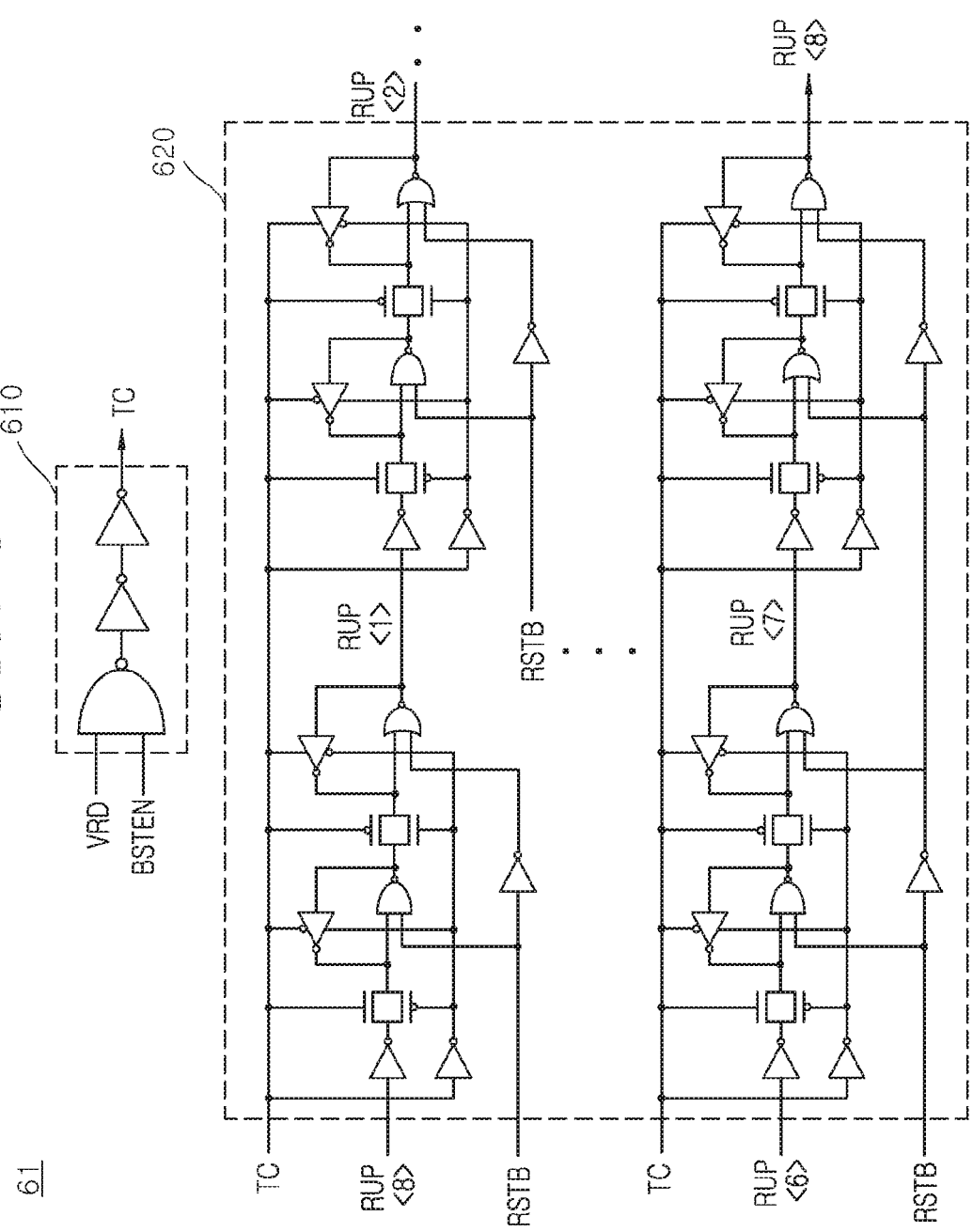
FIG. 8 is a circuit diagram illustrating a representation of an example of the configuration of the rupture counting signal generation circuit included in the rupture information generation circuit illustrated in FIG. 7.

Referring to FIG. 8, the rupture counting signal generation circuit 61 may include a transfer control signal generation circuit 610 and a second counter 620.

The transfer control signal generation circuit 610 may generate a transfer control signal TC which transitions in its level in response to the test enable signal BSTEN and the voltage control signal VRD. The transfer control signal generation circuit 610 may generate the transfer control signal TC of a logic low level in the case where the test enable signal BSTEN is enabled to a logic high level and the voltage control signal VRD is enabled to the logic high level. The transfer control signal generation circuit 610 may generate the transfer control signal TC of a logic high level in the case where the test enable signal BSTEN is enabled to the logic high level and the voltage control signal VRD is disabled to a logic low level.

The second counter 620 may generate the first to eighth rupture counting signals RUP<1:8> which are initialized in response to the reset signal RSTB. The second counter 620 may generate the first to eighth rupture counting signals RUP<1:8> which are initialized, in the case where the reset signal RSTB is enabled to the logic low level. The logic levels of the first to eighth rupture counting signals RUP<1:8> which are initialized may be set to a case where the first to seventh rupture counting signals RUP<1:7> are generated at logic low levels and the eighth rupture counting signal RUP<8> is generated at a logic high level. The second counter 620 may generate the first to eighth rupture counting signals RUP<1:8> which are sequentially counted, in response to the transfer control signal TC. The second counter 620 may generate the first to eighth rupture counting signals RUP<1:8> which are sequentially counted, in the case where the transfer control signal TC transitions in its level from the logic high level to the logic low level. The second counter 620 may generate the first rupture counting signal RUP<1> at a logic high level, in the case where the transfer control signal TC transitions first from the logic high level to the logic low level. The second counter 620 may generate the second rupture counting signal RUP<2> at a logic high level, in the case where the transfer control signal TC transitions second from the logic high level to the logic low level.

Figure 9:
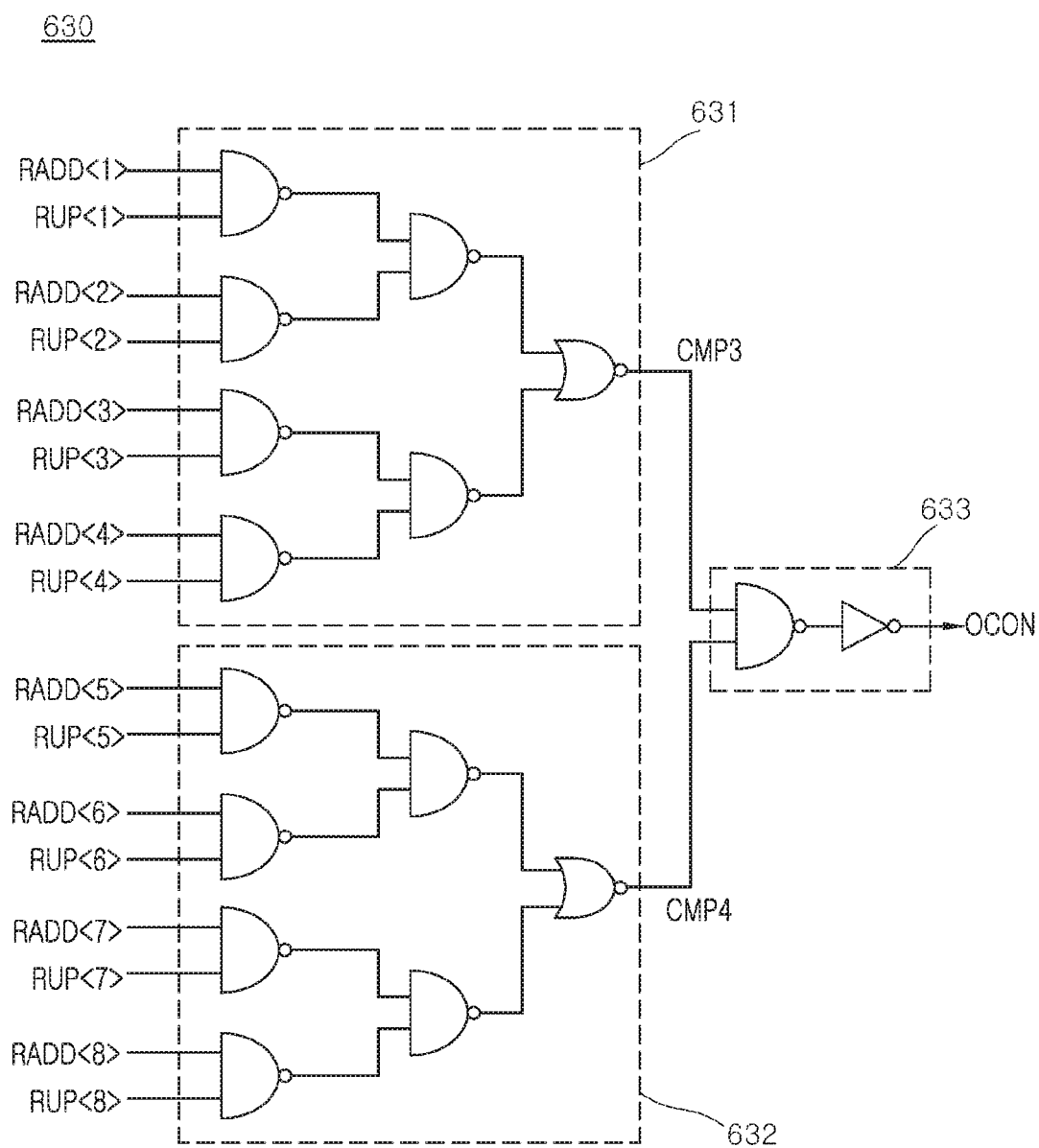
FIG. 9 is a circuit diagram illustrating a representation of an example of the configuration of the output control signal generation circuit included in the rupture information output circuit illustrated in FIG. 7.

Referring to FIG. 9, the output control signal generation circuit 630 may include a third comparison circuit 631, a fourth comparison circuit 632 and a second logic circuit 633.

The third comparison circuit 631 may compare the first to fourth failure addresses RADD<1:4> and the first to fourth rupture counting signals RUP<1:4>, and generate a third comparison signal CMP3. The third comparison circuit 631 may generate the third comparison signal CMP3 which is enabled to a logic low level at a time when any one of the first to fourth failure addresses RADD<1:4> is the logic high level during a period in which the first to fourth rupture counting signals RUP<1:4> are counted.

The fourth comparison circuit 632 may compare the fifth to eighth failure addresses RADD<5:8> and the fifth to eighth rupture counting signals RUP<5:8>, and generate a fourth comparison signal CMP4. The fourth comparison circuit 632 may generate the fourth comparison signal CMP4 which is enabled to a logic low level at a time when any one of the fifth to eighth failure addresses RADD<5:8> is the logic high level during a period in which the fifth to eighth rupture counting signals RUP<5:8> are counted.

The second logic circuit 633 may generate the output control signal OCON by performing an OR logic operation for the third comparison signal CMP3 and the fourth comparison signal CMP4. The second logic circuit 633 may generate the output control signal OCON which is enabled to the logic low level, in the case where any one of the third comparison signal CMP3 and the fourth comparison signal CMP4 is enabled to the logic low level. A logic level at which the output control signal OCON is enabled may be set variously depending on an embodiment.

Figure 10:
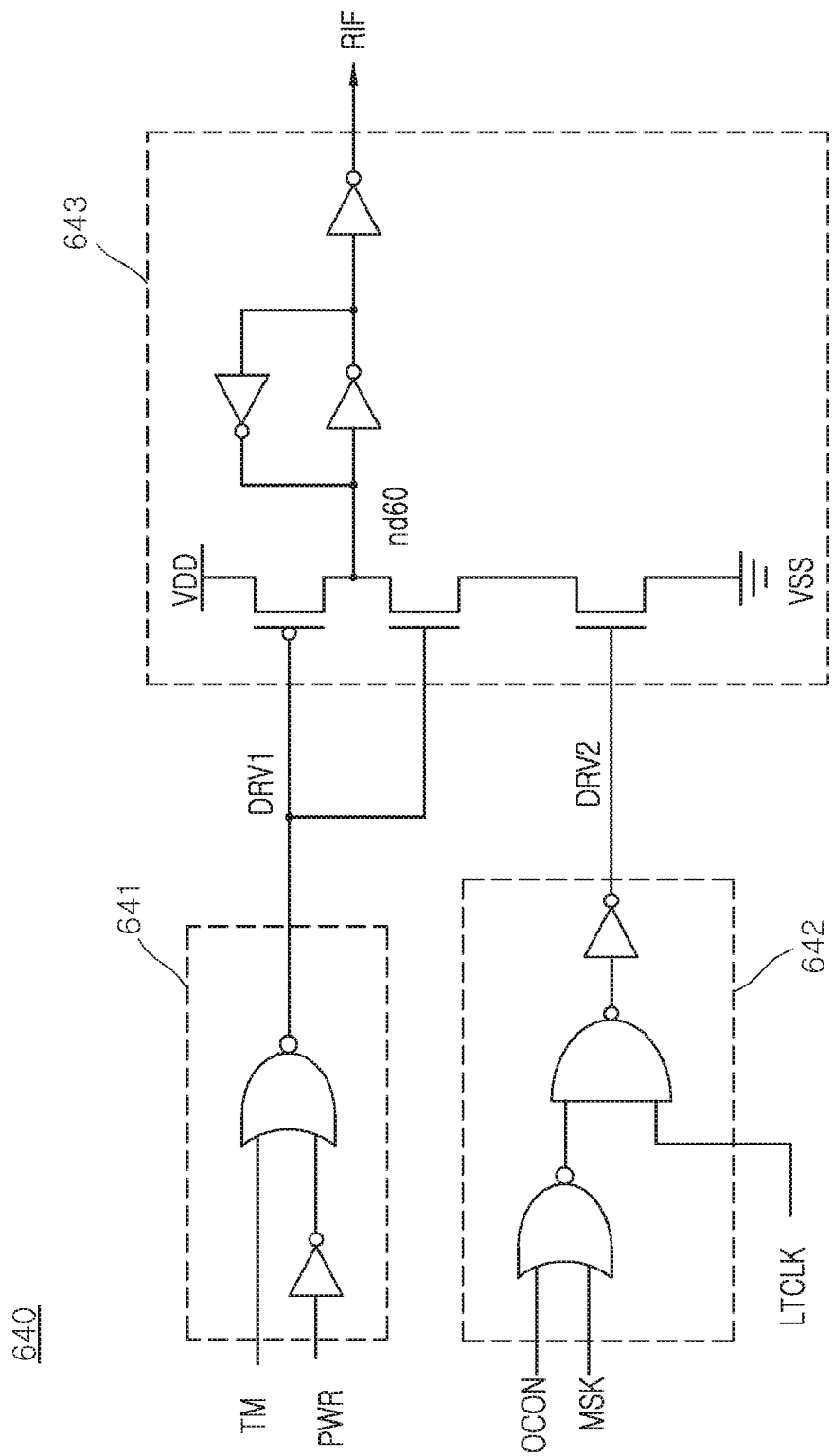
FIG. 10 is a circuit diagram illustrating a representation of an example of the configuration of the rupture information latch circuit included in the rupture information generation circuit illustrated in FIG. 7.

Referring to FIG. 10, the rupture information latch circuit 640 may include a first driving signal generation circuit 641, a second driving signal generation circuit 642 and a driving circuit 643.

The first driving signal generation circuit 641 may generate a first driving signal DRV1 which is enabled in response to the test mode signal TM and the power-up signal PWR. The first driving signal generation circuit 641 may generate the first driving signal DRV1 which is enabled to a logic low level, in the case where the test mode signal TM is enabled to the logic high level. The first driving signal generation circuit 641 may generate the first driving signal DRV1 which is enabled to the logic low level, in the case where the power-up signal PWR is enabled to the logic low level. The first driving signal generation circuit 641 may generate the first driving signal DRV1 which is disabled to a logic high level, in the case where the test mode signal TM is disabled to a logic low level and the power-up signal PWR is disabled to a logic high level.

The second driving signal generation circuit 642 may generate a second driving signal DRV2 in response to the output control signal OCON and the masking signal MSK in synchronization with the latch clock LTCLK. The second driving signal generation circuit 642 may generate the second driving signal DRV2 which is enabled to a logic high level, in the case where the output control signal OCON is enabled to the logic low level and the masking signal MSK is the logic low level in synchronization with the latch clock LTCLK. The second driving signal generation circuit 642 may generate the second driving signal DRV2 which is disabled to a logic low level, in the case where the output control signal OCON is enabled to the logic low level and the masking signal MSK is the logic high level in synchronization with the latch clock LTCLK.

The driving circuit 643 may generate the rupture information RIF by driving a node nd60 in response to the first driving signal DRV1 and the second driving signal DRV2. The driving circuit 643 may generate the rupture information RIF of the logic high level by pull-up driving the node nd60 in the case where the first driving signal DRV1 is enabled to the logic low level. The driving circuit 643 may generate the rupture information RIF of a logic low level by pull-down driving the node nd60 in the case where the first driving signal DRV1 is disabled to the logic high level and the second driving signal DRV2 is enabled to the logic high level. The driving circuit 643 may output the rupture information RIF to the exterior. The case where the rupture information RIF is the logic high level may be set as a case where a rupture operation for a fuse cell array FSA is completed. The case where the rupture information RIF is the logic low level may be set as a case where the rupture operation for the fuse cell array FSA is to be re-performed. FIG. 10 also illustrates power source VDD and ground voltage VSS.

Figure 11:
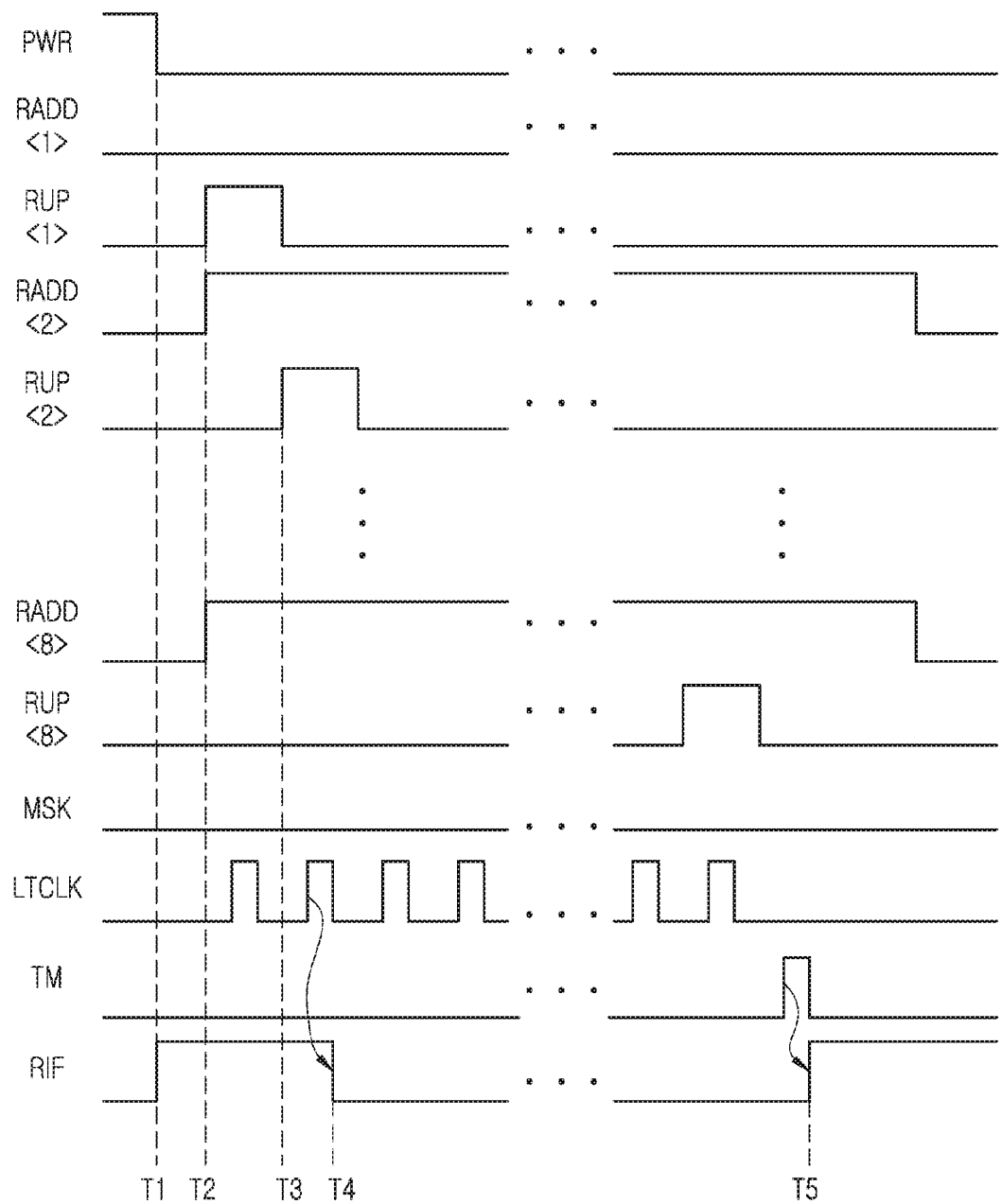
FIG. 11 is a representation of an example of a timing diagram to assist in the explanation of the operation of the rupture information generation circuit illustrated in FIG. 7.

The operation of the rupture information generation circuit 60 will be described below with reference to FIG. 11, by taking as an example a case where the second failure address RADD<2> is the logic high level and a rupture operation is not completed.

At a time T1, the rupture information output circuit 62 generates the rupture information RIF of the logic high level in response to the power-up signal PWR of the logic low level after a power-up period.

At a time T2, the rupture counting signal generation circuit 61 generates the first rupture counting signal RUP<1> at the logic high level. Since the first failure address RADD<1> is a logic low level and the masking signal MSK is the logic low level, the rupture information RIF of the logic high level is generated.

At a time T3, the rupture counting signal generation circuit 61 generates the second rupture counting signal RUP<2> at the logic high level. The second failure address RADD<2> is the logic high level, and the masking signal MSK is the logic low level.

At a time T4, the rupture information output circuit 62 generates the rupture information RIF of the logic low level since the masking signal MSK is the logic low level in synchronization with the latch clock LTCLK. In the case where the rupture information RIF is the logic low level, it is meant that a rupture operation is to be re-performed.

At a time T5, the rupture information output circuit 62 initializes the rupture information RIF to the logic high level in response to the test mode signal TM of the logic high level.

Figure 12:
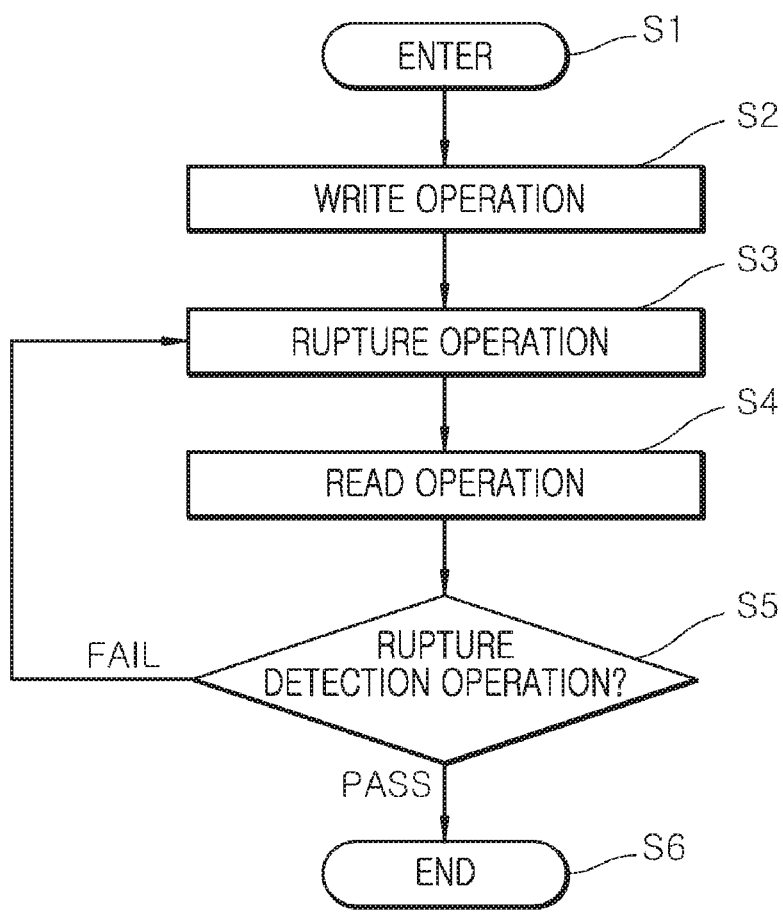
FIG. 12 is a representation of an example of a flow chart to assist in the explanation of a fuse rupture method in accordance with an embodiment.

A fuse rupture method in accordance with an embodiment will be described below with reference to FIG. 12 by taking as an example a case where a rupture operation for the first fuse data FZD1<1:8> is completed when the rupture operation is re-performed once.

First, when the fuse rupture method of an embodiment is entered (S1) and a write operation is performed (S2), the memory circuit 1 generates the first repair information MRD1<1:M> including the position information of a memory cell MC where a failure has occurred.

The address generation circuit 2 generates the first to eighth internal addresses IADD<1:8> from the first repair information MRD1<1:M> in response to the first pulse of the latch enable signal LCEN. The address generation circuit 2 generates the first to eighth failure addresses RADD<1:8> from the first repair information MRD1<1:M> in response to the second pulse of the latch enable signal LCEN.

When performing a rupture operation (53), the fuse array circuit 3 performs a rupture operation for a fuse cell array FSA which is selected depending on the internal addresses IADD<1:8> in a write operation, to correspond to the first to eighth failure addresses RADD<1:8>. The fuse array circuit 3 stores the first fuse data FZD1<1:8> which have the same logic level combination as the first to eighth failure addresses RADD<1:8>.

When performing a read operation (S4), the fuse array circuit 3 outputs the first fuse data FZD1<1:8> in response to the read control signal RDON which is enabled in the read operation.

When performing a rupture detection operation (55), the fuse control circuit 4 compares the logic level combination of the first fuse data FZD1<1:8> and the logic level combination of the first to eighth failure addresses RADD<1:8>. Since the logic level combination of the first fuse data FZD1<1:8> and the logic level combination of the first to eighth failure addresses RADD<1:8> are different (FAIL), the fuse control circuit 4 re-performs the rupture operation (S3).

The fuse control circuit 4 applies a high current to the fuse cell array FSA in which the first fuse data FZD1<1:8> are stored.

When performing a read operation (S4), the fuse array circuit 3 outputs the first fuse data FZD1<1:8> in response to the read control signal RDON which is enabled in the read operation.

When performing a rupture detection operation (S5), the fuse control circuit 4 compares the logic level combination of the first fuse data FZD1<1:8> and the logic level combination of the first to eighth failure addresses RADD<1:8>. Since the logic level combination of the first fuse data FZD1<1:8> and the logic level combination of the first to eighth failure addresses RADD<1:8> are the same (PASS), the rupture operation is ended (S6).

As is apparent from the above descriptions, in the semiconductor device in accordance with an embodiment, by detecting a result of a rupture operation and re-performing the rupture operation in the case where the rupture operation is not completed as a result of detection, it may be possible to secure the reliability of a fuse rupture operation. Also, in the semiconductor device in accordance with an embodiment, by detecting a result of a rupture operation and outputting a detection result to an exterior, it may be possible to monitor the rupture operation.

Figure 13:
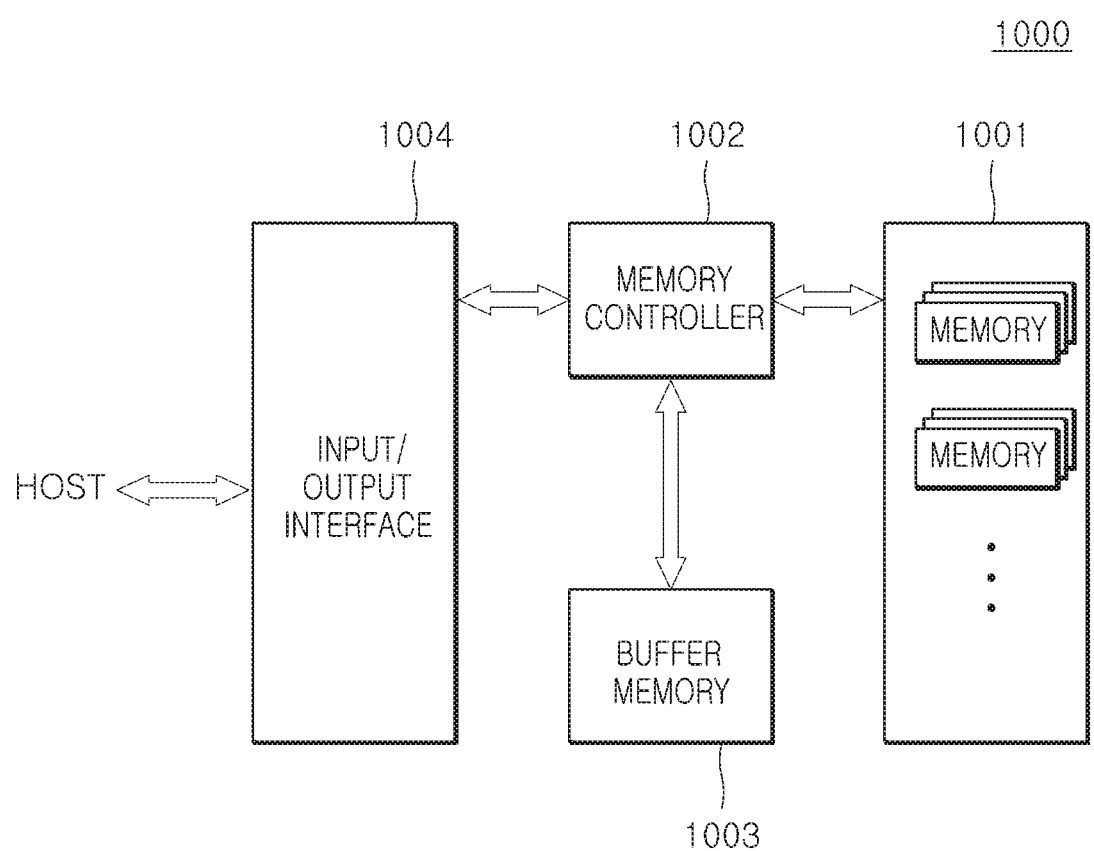
FIG. 13 is a diagram illustrating a representation of an example of the configuration of an electronic system to which the semiconductor device illustrated in FIGS. 1 to 12 is applied.

The semiconductor device described above with reference to FIGS. 1 to 12 may be applied to an electronic system which includes a memory system, a graphic system, a computing system or a mobile system. For example, referring to FIG. 13, an electronic system 1000 in accordance with an embodiment may include a data storage 1001, a memory controller 1002, a buffer memory 1003, and an input/output interface 1004.

The data storage 1001 stores data applied from the memory controller 1002, and reads out stored data and outputs the read-out data to the memory controller 1002, according to control signals from the memory controller 1002. The data storage 1001 may include the semiconductor device illustrated in FIG. 1. The data storage 1001 may include a nonvolatile memory capable of not losing and continuously storing data even though power supply is interrupted. A nonvolatile memory may be realized as a flash memory such as a NOR flash memory and a NAND flash memory, a phase change random access memory (PRAM), a resistive random access memory (RRAM), a spin transfer torque random access memory (STTRAM) or a magnetic random access memory (MRAM).

The memory controller 1002 decodes commands applied through the input/output interface 1004 from an external device (a host), and controls input/output of data with respect to the data storage 1001 and the buffer memory 1003 according to decoding results. While the memory controller 1002 is illustrated as one block in FIG. 13, it is to be noted that, in the memory controller 1002, a controller for controlling a nonvolatile memory and a controller for controlling the buffer memory 1003 as a volatile memory may be independently configured. The buffer memory 1003 may temporarily store data to be processed in the memory controller 1002, that is, data to be inputted and outputted to and from the data storage 1001. The buffer memory 1003 may store data applied from the memory controller 1002 according to a control signal. The buffer memory 1003 reads out stored data and outputs the read-out data to the memory controller 1002. The buffer memory 1003 may include a volatile memory such as a DRAM (dynamic random access memory), a mobile DRAM and an SRAM (static random access memory).

The input/output interface 1004 provides a physical coupling between the memory controller 1002 and the external device (the host) such that the memory controller 1002 may receive control signals for input/output of data from the external device and exchange data with the external device. The input/output interface 1004 may include one among various interface protocols such as USB, MMC, PCI-E, SAS, SATA, PATA, SCSI, ESDI and IDE.

The electronic system 1000 may be used as an auxiliary memory device or an external storage device of the host. The electronic system 1000 may include a solid state disk (SSD), a USB memory (universal serial bus memory), a secure digital (SD) card, a mini-secure digital (mSD) card, a micro SD card, a secure digital high capacity (SDRC) card, a memory stick card, a smart media (SM) card, a multimedia card (MMC), an embedded MMC (eMMC), or a compact flash (CF) card.

While various embodiments have been described above, it will be understood to those skilled in the art that the embodiments described are by way of example only. Accordingly, the fuse rupture method and the semiconductor device using the same described herein should not be limited based on the described embodiments.

What is claimed is:

1. A semiconductor device comprising:
   a fuse array circuit including a plurality of fuse cell arrays, and configured to output fuse data based on one or more fuses that have been ruptured or not within a fuse cell array; and
   a fuse control circuit configured to compare the fuse data and one or more failure addresses, and re-perform a rupture operation for the fuse cell array when the fuse data and the failure addresses indicate a difference between the fuse data and the failure addresses.

2. The semiconductor device according to claim 1, wherein the fuse control circuit is configured to compare a logic level combination of the fuse data and a logic level combination of the one or more failure addresses, and re-perform a rupture operation for the fuse cell array when the logic level combination of the fuse data and the logic level combination of the failure addresses are different.

3. The semiconductor device according to claim 2, wherein the fuse array circuit outputs the fuse data having the same logic levels as logic levels of the failure addresses as the fuse cell array is ruptured.

4. The semiconductor device according to claim 1, wherein the failure addresses include position information of a memory cell where a failure has occurred, among memory cells included in the memory circuit, and is generated from repair information inputted from an exterior.

5. The semiconductor device according to claim 2, wherein the fuse control circuit outputs rupture information which is enabled, to an exterior, when the logic level combinations of the fuse data and the failure addresses are different.

6. The semiconductor device according to claim 2, wherein the fuse control circuit comprises:
   a detection circuit configured to compare the logic levels of the fuse data and a level of a reference voltage based on a voltage control signal, and generate detection signals;
   a masking signal generation circuit configured to generate a masking signal which is enabled, when logic level combinations of the detection signals and the failure addresses are different;

a rupture control signal generation circuit configured to generate a rupture control signal which is enabled based on a rupture enable signal and the masking signal and is disabled based on a rupture disable signal and the masking signal; and
a rupture control circuit configured to apply a high current to the fuse cell array in which the fuse data are stored, when the rupture control signal is enabled.

7. The semiconductor device according to claim 6, wherein the detection circuit comprises:
a reference voltage generation circuit configured to generate the reference voltage, a level of which is adjusted based on the voltage control signal; and
a detection signal generation circuit configured to compare the reference voltage and the logic levels of the fuse data, and generate the detection signals.

8. The semiconductor device according to claim 6,
wherein the detection signals include first to fourth detection signals,
wherein the failure addresses include first to fourth failure addresses, and
wherein the masking signal generation circuit comprises:
a first comparison circuit configured to compare the first and second detection signals and the first and second failure addresses, and generate a first comparison signal;
a second comparison circuit configured to compare the third and fourth detection signals and the third and fourth failure addresses, and generate a second comparison signal; and
a logic circuit configured for generating the masking signal which is enabled, when any one of the first comparison signal and the second comparison signal is enabled.

9. The semiconductor device according to claim 6, wherein the rupture control signal generation circuit comprises:
a setting signal generation circuit configured to generate a setting signal which is enabled based on the rupture enable signal and the masking signal;
a buffer circuit configured to generate an inverted rupture disable signal by inverting and buffering the rupture disable signal, and generate an inverted masking signal by inverting and buffering the masking signal; and
a rupture control signal output circuit configured to generate the rupture control signal which is enabled based on the setting signal and is disabled based on the inverted rupture disable signal and the inverted masking signal.

10. The semiconductor device according to claim 1, wherein the fuse control circuit further comprises:
a control circuit configured to generate a read control signal, a voltage control signal, a rupture enable signal and a rupture disable signal based on a reset signal and a test enable signal; and
a rupture information generation circuit configured to be initialized based on a power-up signal, and output a rupture information including a completion information of the rupture operation for the fuse cell array, based on the voltage control signal.

11. The semiconductor device according to claim 10, wherein the control circuit comprises:
a counter configured to be initialized based on the reset signal, and generate first and second counting signals which are sequentially counted based on the test enable signal; and a decoder configured to generate the read control signal, the voltage control signal, the rupture enable signal and the rupture disable signal which are sequentially enabled depending on a logic level combination of the first and second counting signals, based on the test enable signal.

12. The semiconductor device according to claim 10, wherein the rupture information generation circuit comprises:
a rupture counting signal generation circuit configured to be initialized based on the reset signal, and generate rupture counting signals which are sequentially counted, based on the voltage control signal; and
a rupture information output circuit configured to be initialized based on a test mode signal and the power-up signal, and output the rupture information depending on logic levels of the rupture counting signals and the masking signal.

13. The semiconductor device according to claim 12, wherein the rupture information output circuit comprises:
an output control signal generation circuit configured to compare the rupture counting signals and the failure addresses to generate an output control signal; and
a rupture information latch circuit configured to generate the rupture information depending on the logic level masking signal based on the output control signal and a latch clock.

14. A semiconductor device comprising:
a fuse array circuit including first and second fuse cell arrays, and configured to output first and second fuse data depending on whether the first and second fuse cell arrays include one or more fuses that are ruptured or not; and
a fuse control circuit configured to sequentially compare logic levels of the first and second fuse data and logic levels of failure addresses, re-perform a rupture operation for the first fuse cell array corresponding to the first fuse data when the logic levels of the first fuse data are different from the logic levels of the failure addresses, and re-perform a rupture operation for the second fuse cell array corresponding to the second fuse data when the logic levels of the second fuse data are different from the logic levels of the failure addresses.

15. The semiconductor device according to claim 14, wherein the rupture operation for the second fuse cell array is performed after the rupture operation for the first fuse cell array is completed, and is repeatedly performed until the rupture operation is completed.

16. The semiconductor device according to claim 14, wherein the fuse control circuit comprises:
a detection circuit configured to generate detection signals by comparing the logic levels of the first fuse data and a level of a reference voltage, and generating the detection signals by comparing the logic levels of the second fuse data and the level of the reference voltage;
a masking signal generation circuit configured to generate a masking signal which is enabled, when logic level combinations of the detection signals and the failure addresses are different;
a rupture control signal generation circuit configured to generate a rupture control signal which is enabled based on a rupture enable signal and the masking signal and is disabled based on a rupture disable signal and the masking signal; and a rupture control circuit configured to apply a high current to the fuse cell arrays in which the first and second fuse data are stored, when the rupture control signal is enabled.

17. The semiconductor device according to claim 16, wherein the detection circuit comprises:
a reference voltage generation circuit configured to generate the reference voltage, a level of which is adjusted based on a voltage control signal; and
a detection signal generation circuit configured to generate the detection signals by comparing the logic levels of the reference voltage and the first fuse data, and generate the detection signals by comparing the logic levels of the reference voltage and the second fuse data.

18. The semiconductor device according to claim 16, wherein the detection signals include first to fourth detection signals,
wherein the failure addresses include first to fourth failure addresses, and
wherein the masking signal generation circuit comprises:
a first comparison circuit configured to compare the first and second detection signals and the first and second failure addresses, and generate a first comparison signal;
a second comparison circuit configured to compare the third and fourth detection signals and the third and fourth failure addresses, and generate a second comparison signal; and
a logic circuit configured for generating the masking signal which is enabled, when any one of the first comparison signal and the second comparison signal is enabled.

19. The semiconductor device according to claim 16, wherein the rupture control signal generation circuit comprises:
a setting signal generation circuit configured to generate a setting signal which is enabled based on the rupture enable signal and the masking signal;
a buffer circuit configured to generate an inverted rupture disable signal by inverting and buffering the rupture disable signal, and generate an inverted masking signal by inverting and buffering the masking signal; and
a rupture control signal output circuit configured to generate the rupture control signal which is enabled based on the setting signal and is disabled based on the inverted rupture disable signal and the inverted masking signal.

20. The semiconductor device according to claim 14, wherein the fuse control circuit comprises:
a control circuit configured to generate a read control signal, a voltage control signal, a rupture enable signal and a rupture disable signal based on a reset signal and a test enable signal; and
a rupture information generation circuit configured to be initialized based on a power-up signal, and output a rupture information including a completion information of the rupture operation for the fuse cell array, based on the voltage control signal.

21. The semiconductor device according to claim 20, wherein the control circuit comprises:
a counter configured to be initialized based on the reset signal, and generate first and second counting signals which are sequentially counted based on the test enable signal; and
a decoder configured to generate the read control signal, the voltage control signal, the rupture enable signal and the rupture disable signal which are sequentially enabled depending on a logic level combination of the first and second counting signals, based on the test enable signal.

22. The semiconductor device according to claim 20, wherein the rupture information generation circuit comprises:
a rupture counting signal generation circuit configured to be initialized based on the reset signal, and generate rupture counting signals which are sequentially counted, based on the voltage control signal; and
a rupture information output circuit configured to be initialized based on a test mode signal and the power-up signal, and output the rupture information depending on logic levels of the rupture counting signals and the masking signal.

23. The semiconductor device according to claim 22, wherein the rupture information output circuit comprises:
an output control signal generation circuit configured to compare the rupture counting signals and the failure addresses to generate an output control signal; and
a rupture information latch circuit configured to generate the rupture information depending on the logic level masking signal based on the output control signal and a latch clock.

24. A fuse rupture method comprising:
performing a read operation of outputting fuse data depending on whether one or more fuses for each of a plurality of fuse cell arrays is ruptured or not; and
comparing the fuse data and failure addresses, and re-performing a rupture operation for a corresponding fuse cell array when logic level combinations of the fuse data and the failure addresses are different.

25. The fuse rupture method according to claim 24, wherein the failure addresses include position information of a memory cell where a failure has occurred, among memory cells included in a memory circuit, and is generated from repair information inputted from an exterior.

26. The fuse rupture method according to claim 24, wherein, the rupture operation is ended when the logic level combinations of the fuse data and the failure addresses are the same.

27. The fuse rupture method according to claim 24, further comprising:
a write operation of generating internal addresses and the failure addresses from the repair information which is inputted from the exterior, and storing the fuse data having the same logic level combination as the failure addresses, by rupturing the one or more fuses of the fuse cell array which is selected depending on a logic level combination of the internal addresses.

28. The semiconductor device according to claim 1, wherein the re-perform the rupture operation is an operation to rupture again the fuse arrays in which the rupture operation is not completed.

29. The semiconductor device according to claim 14, wherein the re-perform the rupture operation is an operation to rupture again the fuse arrays in which the rupture operation is not completed.

30. The fuse rupture method according to claim 24, wherein the re-performing the rupture operation is an operation to rupture again the fuse arrays in which the rupture operation is not completed.

* * * * *